(12) United States Patent
Creswick et al.

(10) Patent No.: US 7,417,221 B2
(45) Date of Patent: Aug. 26, 2008

(54) AUTOMOTIVE VEHICLE IMAGE SENSOR

(75) Inventors: Steven B. Creswick, Ravenna, MI (US); Stephen L. Otey, Hudsonville, MI (US); Spencer D. Reese, Auburn, IN (US); Jon H. Bechtel, Holland, MI (US); Joseph S. Stam, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 70 days.

(21) Appl. No.: 11/467,336

(22) Filed: Aug. 25, 2006

(65) Prior Publication Data
US 2007/0051885 A1 Mar. 8, 2007

Related U.S. Application Data

(60) Provisional application No. 60/715,315, filed on Sep. 8, 2005.

(51) Int. Cl.
*H01L 27/14* (2006.01)
(52) U.S. Cl. .................. 250/239; 250/208.1; 250/216; 257/433; 257/434
(58) Field of Classification Search ............... 250/239, 250/208.1, 216; 257/431–434
See application file for complete search history.

(56) References Cited

U.S. PATENT DOCUMENTS

| | | | |
|---|---|---|---|
| 5,711,889 A | 1/1998 | Buchsbaum | |
| 5,837,994 A | 11/1998 | Stam et al. | |
| 5,923,027 A | 7/1999 | Stam et al. | |
| 5,990,469 A | 11/1999 | Bechtel et al. | |
| 6,008,486 A | 12/1999 | Stam et al. | |
| 6,049,171 A | 4/2000 | Stam et al. | |
| 6,130,421 A | 10/2000 | Bechtel et al. | |
| 6,130,448 A | 10/2000 | Bauer et al. | |
| 6,403,942 B1 | 6/2002 | Stam | |
| 6,465,963 B1 | 10/2002 | Turnbull et al. | |
| 6,538,243 B1 * | 3/2003 | Bohn et al. ............... | 250/208.1 |
| 6,566,745 B1 * | 5/2003 | Beyne et al. ................ | 257/680 |
| 6,587,573 B1 | 7/2003 | Stam et al. | |
| 6,611,610 B1 | 8/2003 | Stam et al. | |

(Continued)

FOREIGN PATENT DOCUMENTS

GB     2 401 270 A     11/2004

(Continued)

OTHER PUBLICATIONS

Shweki, I., Badihi, A., A CSP Optoelectronic Package For Imaging And Light Detection Applications, Part of the IS&T/SPIE Conference on Sensors, Cameras, and Applications for Digital Photography, SPIE vol. 3650, Jan. 1999.*

(Continued)

*Primary Examiner*—Stephen Yam
(74) *Attorney, Agent, or Firm*—Brooks Kushman P.C.

(57) ABSTRACT

An image sensor may be constructed as an imager die onto which is adhered an optical spacer. The imager die and optical spacer may be supported by a dam-and-fill construction which allows light to pass through the optical spacer and onto the imager die. The image sensor may generate control signals for use in a variety of automatic vehicle equipment controls and may be incorporated into an automotive vehicle such as by inclusion into a rearview mirror assembly.

17 Claims, 8 Drawing Sheets

U.S. PATENT DOCUMENTS

| | | |
|---|---|---|
| 6,617,566 B2 | 9/2003 | Kartalopolos |
| 6,621,616 B1 | 9/2003 | Bauer et al. |
| 6,631,316 B2 | 10/2003 | Stam et al. |
| 6,638,668 B2 | 10/2003 | Buchsbaum et al. |
| 6,681,163 B2 | 1/2004 | Stam et al. |
| 6,727,431 B2 * | 4/2004 | Hashimoto ............. 174/539 |
| 6,765,236 B2 * | 7/2004 | Sakurai ............. 257/98 |
| 6,928,180 B2 | 8/2005 | Stam et al. |
| 6,947,576 B2 | 9/2005 | Stam et al. |
| 7,259,438 B2 * | 8/2007 | Yamamoto et al. ............. 257/433 |
| 7,279,782 B2 * | 10/2007 | Yang et al. ............. 257/680 |
| 2002/0156559 A1 | 10/2002 | Stam et al. |
| 2003/0107323 A1 | 6/2003 | Stam |
| 2003/0124762 A1* | 7/2003 | Hashimoto ............. 438/67 |
| 2003/0205661 A1 | 11/2003 | Schofield et al. |
| 2004/0008410 A1 | 1/2004 | Stam et al. |
| 2004/0021853 A1 | 2/2004 | Stam et al. |
| 2004/0143380 A1 | 7/2004 | Stam et al. |
| 2004/0164228 A1 | 8/2004 | Fogg et al. |
| 2004/0201483 A1 | 10/2004 | Stam et al. |
| 2004/0232773 A1 | 11/2004 | Parker |
| 2005/0153219 A1 | 7/2005 | Buchsbaum et al. |
| 2006/0016965 A1 | 1/2006 | Stam et al. |
| 2006/0018511 A1 | 1/2006 | Stam et al. |
| 2006/0177098 A1 | 8/2006 | Stam |

FOREIGN PATENT DOCUMENTS

| | | | |
|---|---|---|---|
| JP | 57174993 A | * | 10/1982 |
| JP | 58162180 A | * | 9/1983 |
| JP | 61123288 A | * | 6/1986 |

OTHER PUBLICATIONS

Micron—MT9V022: ⅓-Inch Wide-VGA Digital Image Sensor Features, ⅓-Inch Wide-VGA CMOS Digital Image Sensor www.micron.com/imaging.

Written Opinion of the International Searching Authority for PCT/US2006/034137.

Notification of Transmittal of the International Search Report and the Written Opinion of the International Searching Authority, or the Declaration for PCT/US2006/034137.

* cited by examiner

AUTOMOTIVE VEHICLE IMAGE SENSOR

CROSS-REFERENCE TO RELATED APPLICATIONS

This application claims the benefit of U.S. provisional application Ser. No. 60/715,315 filed Sep. 8, 2005, which is herein incorporated by reference in its entirety.

DETAILED DESCRIPTION OF THE PREFERRED EMBODIMENT(S)

Many vehicle equipment control systems have been proposed that incorporate imaging systems and related processors. Vehicle exterior light control systems using a camera and image processing system have been developed and disclosed in commonly assigned U.S. Pat. Nos. 5,837,994, 5,990,469, 6,008,486, 6,130,448, 6,130,421, 6,049,171, 6,465,963, 6,403,942, 6,587,573, 6,611,610, 6,621,616 and 6,631,316; and U.S. patent application Ser. Nos. 10/208,142 (now U.S. Pat. No. 6,774,988), 09/799,310 (now U.S. Pat. No. 6,631,316), 60/404,879 (U.S. application Ser. No. 10/645,801, published as U.S. Publication No. 2004/0143380, claims the benefit of 60/404,879), 60/394,583 (now U.S. application Ser. No. 10/615,317, published as U.S. Publication No. 2004/0008410, claims the benefit of 60/394,583), 10/235,476 (now U.S. Pat. No. 6,861,809), 10/783,431 (now U.S. Pat. No. 6,895,684), 10/777,468 (published as U.S. Publication No. 2004/0201483), 09/800,460 (now U.S. Pat. No. 6,520,203) and 60/590,736 (U.S. application Ser. No. 11/185,145, published as U.S. Publication No. 2006/0016965, claims the benefit of 60/590,736); the disclosures of which are incorporated herein in their entireties by reference. In these systems, images are acquired of the view forward of a motor vehicle. In at least one embodiment, an image sensor is optically coupled to the interior surface of the windshield such that reflections and/or refraction from the interior windshield surface is substantially eliminated. These images are processed to determine the presence or absence of oncoming or preceding vehicles and the controlled vehicles exterior lights are adjusted, for example by turning off the high beams, to prevent glare to the drivers of other vehicles. Several of these disclosed systems provide multiple equipment functions such as moisture sensing and windshield wiper control, heating ventilating and air conditioning (HVAC) control, lane departure systems, adaptive cruise control, collision avoidance and/or reconstruction systems, security systems, etc.

Moisture sensing, windshield wiper and HVAC controls are described in commonly assigned U.S. Pat. Nos. 5,923,027 and 6,617,566 as well as U.S. patent application Ser. Nos. 09/970,728 (now U.S. Pat. No. 6,681,163) and 60/472,017 (U.S. application Ser. No. 10/848,803, published as U.S. Publication No. 2004/0232773, claims the benefit of 60/472,017), the entire disclosures of which are incorporated herein by reference.

Figure 1:
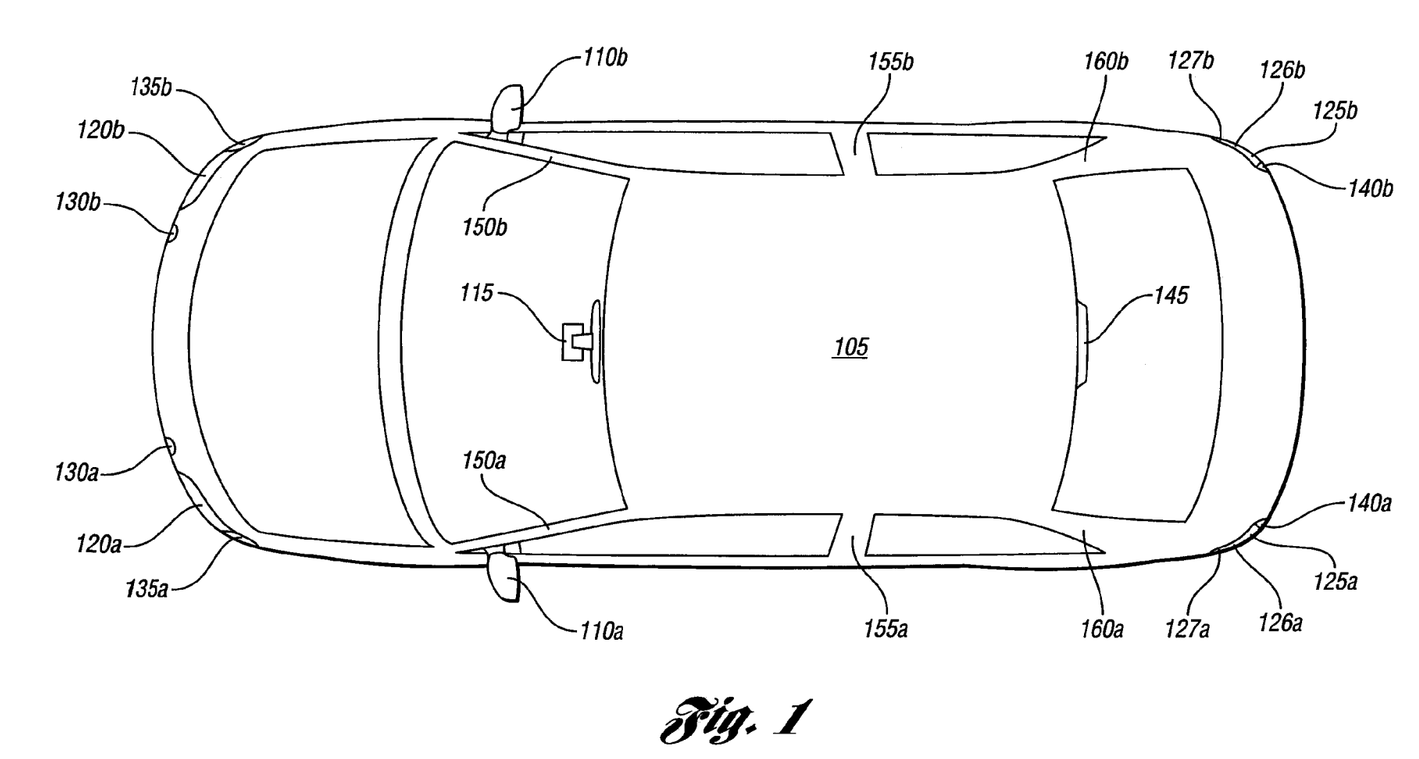
FIG. 1 is a schematic drawing of an automotive vehicle that may incorporate the present invention.

With reference to FIG. 1, controlled vehicle 105 may include a variety of exterior lights, such as headlight assemblies 120a, 120b, foul conditions lights 130a, 130b, front turn signal indicators 135a, 135b, taillight assembly 125a, 125b, rear turn signal indicators 126a, 126b, rear emergency flashers 127a, 127b, backup lights 140a, 140b, and center high mounted stop light (CHMSL) 145. In at least one embodiment, a foul weather lighting system is configured such that fog is detected with an image sensor and at least one taillight and/or CHMSL is illuminated to warn trailing vehicles of the controlled vehicle ahead. In at least one embodiment, the driver's side taillight is illuminated at the brightness equivalent to when illuminated as a brake light. These systems are particularly useful in European countries where this feature is desirable. It should be understood that at least one forward facing foul condition light may be automatically activated as well.

As described in detail herein, the controlled vehicle may comprise at least one control system incorporating various components that provide shared function with other vehicle equipment. An example of one control system integrates various components associated with automatic control of the reflectivity of at least one rearview mirror element and automatic control of at least one exterior light. Such systems 115 may comprise at least one image sensor within a rearview mirror, an A-pillar 150a, 150b, a B-pillar 155a, 155b, a C-pillar 160a, 160b, a CHMSL, or elsewhere within or upon the controlled vehicle. Images acquired, or portions thereof, may be used for automatic vehicle equipment control. The images, or portions thereof, may alternatively, or additionally, be displayed on one or more displays. At least one display may be covertly positioned behind a transflective, or at least partially transmissive, electro-optic element. A common controller may be configured to generate at least one mirror element drive signal and at least one other equipment control signal.

An image sensor for use in automatic vehicle equipment control may be constructed as an imager die onto which is adhered an optical spacer. The imager die and optical spacer may be supported by a dam-and-fill construction which allows light to pass through the optical spacer and onto the imager die. The image sensor may generate control signals for use in a variety of automatic vehicle equipment controls, such as an automatic exterior light control system, a moisture sensing system, a windshield wiper control, a defroster control, a defogger control, a lane departure detection system, a lane departure warning system, a security system, a vision system, a rear vision system, a mirror dimming system, an occupancy detection system, a monitoring system, a collision avoidance system, an accident recreation system, an image acquisition system, and the like. The image sensor may be used in an automotive vehicle such as by incorporation into a rearview mirror assembly.

Figure 2:
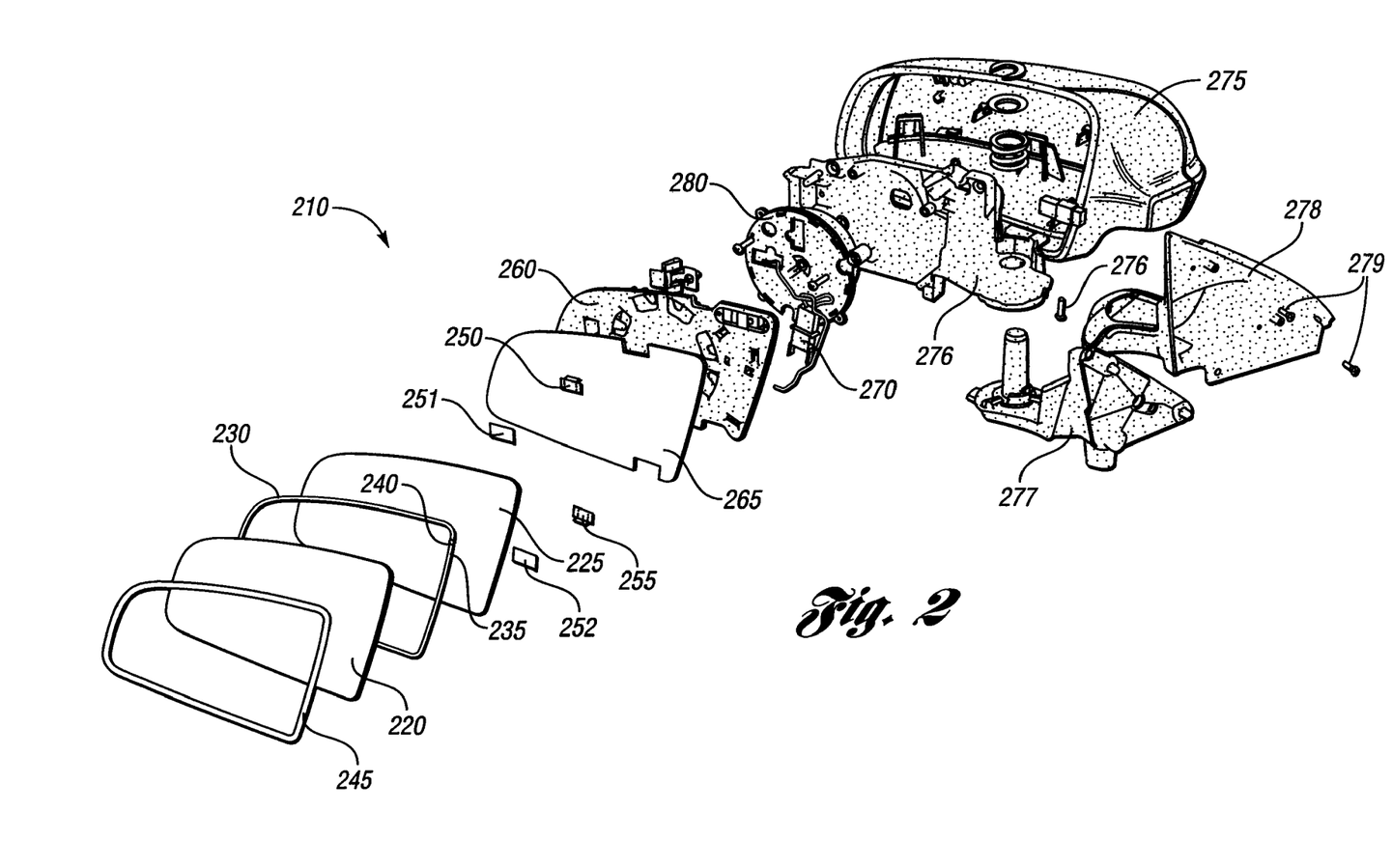
FIG. 2 is an exploded view drawing of an outside rearview mirror assembly according to an embodiment of the present invention.

Turning now to FIG. 2, various components of an outside rearview mirror assembly 210 are depicted. As described in detail herein, an electro-optic mirror element may comprise a first substrate 220 secured in a spaced apart relationship with a second substrate 225 via a primary seal 230 to form a chamber there between. At least a portion of the primary seal is left void to form at least one chamber fill port 235. An electro-optic medium is enclosed in the chamber and the fill port(s) are sealingly closed via a plug material 240. Preferably, the plug material is a UV curable epoxy or acrylic material. Also shown is a spectral filter material 245 located near the periphery of the element. Electrical clips 250, 255 are preferably secured to the element, respectively, via first adhesive material 251, 252. The element is secured to a carrier plate 260 via second adhesive material 265. Electrical connections from the outside rearview mirror to other components of the controlled vehicle are preferably made via a connector 270. The carrier is attached to an associated housing mount 276 via a positioner 280. Preferably, the housing mount is engaged with a housing 275 and secured via at least one fastener 276. Preferably the housing mount comprises a swivel portion configured to engage a swivel mount 277. The swivel mount is preferably configured to engage a vehicle mount 278 via at least one fastener 279. The image sensor may be incorporated into housing 275, swivel mount 277, vehicle mount 278, or the like.

Figure 3A:
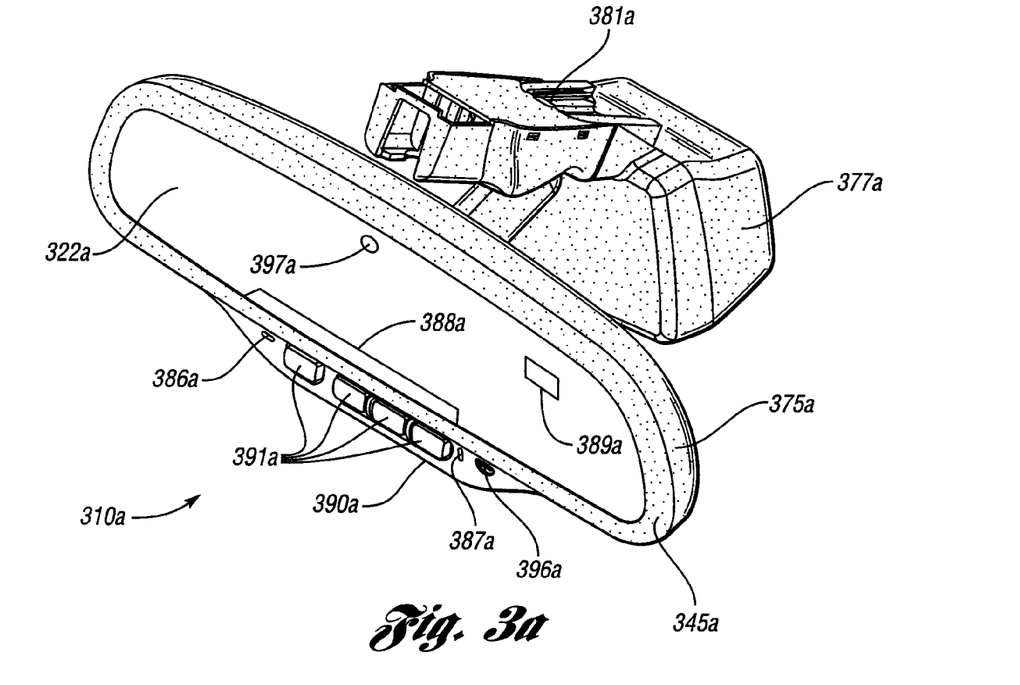
FIGS. 3a and 3b are drawings of an inside rearview mirror assembly according to an embodiment of the present invention.
Figure 3B:
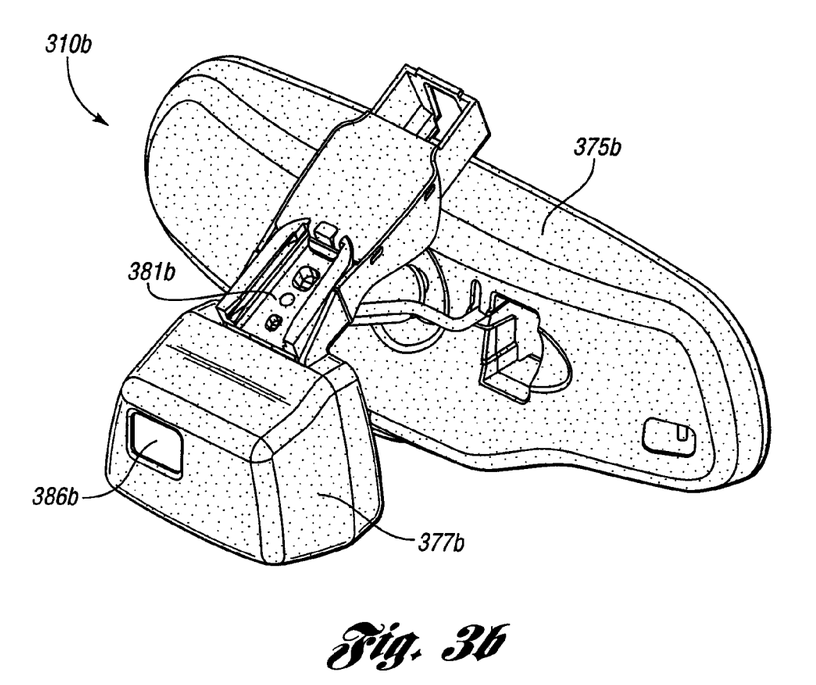

Turning now to FIGS. 3a and 3b, there are shown an inside rearview mirror assembly 310a, 310b as viewed looking at the first substrate 322a with a spectral filter material 345a positioned between the viewer and a primary seal material (not shown). The mirror element is shown to be positioned within a movable housing 375a, 375b and combined with a stationary housing 377a, 377b on a mounting structure 381a, 381b. Stationary housing 377a, 377b includes aperture 386b defining an image sensor visual opening. Additional details on rearview mirrors including image sensors may be found in commonly assigned U.S. patent application Ser. No. 10/783, 273 (published as U.S. Publication No. 2004/0164228), which is herein incorporated by reference in its entirety. A first indicator 386a, a second indicator 387a, operator interfaces 391a and a first photo sensor 396a are positioned in a chin portion 390a of the movable housing. A first information display 388a, a second information display 389a and a second photo sensor 397a are incorporated within the assembly such that they are behind the element with respect to the viewer. As described with regard to the outside rearview mirror assembly, it is preferable to have devices 388a, 389a, 397a at least partially covert. For example, a "window" may be formed in the associated mirror element third and/or fourth surface coatings and configured to provide a layer of a platinum group metal (PGM) (i.e. iridium, osmium, palladium, platinum, rhodium, and ruthenium) only on the third surface. Thereby, light rays impinging upon the associated "covert" photo sensor "glare" will first pass through the first surface stack, if any, the first substrate, the second surface stack, the electro-optic medium, the platinum group metal and, finally, the second substrate. The platinum group metal functions to impart continuity in the third surface conductive electrode, thereby, reducing electro-optic medium coloring variations associated with the window.

Figure 4:
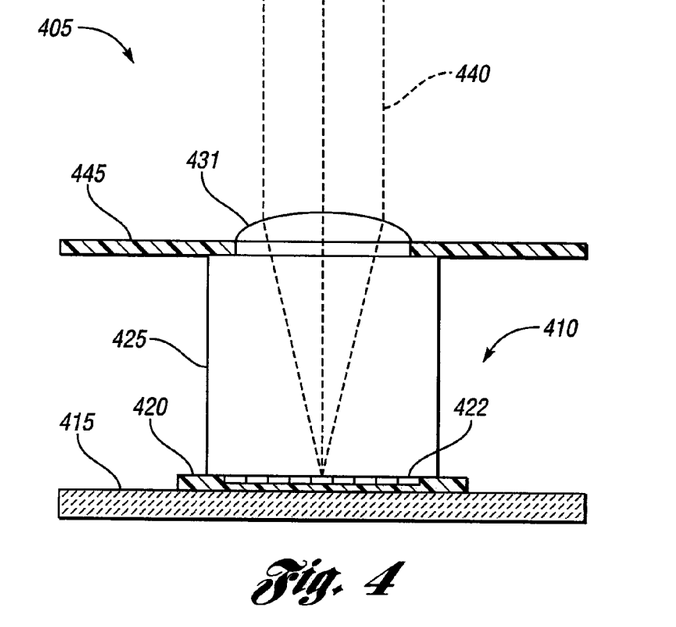
FIG. 4 is a schematic drawing of an automotive vehicle imaging system according to an embodiment of the present invention.
Figure 5:
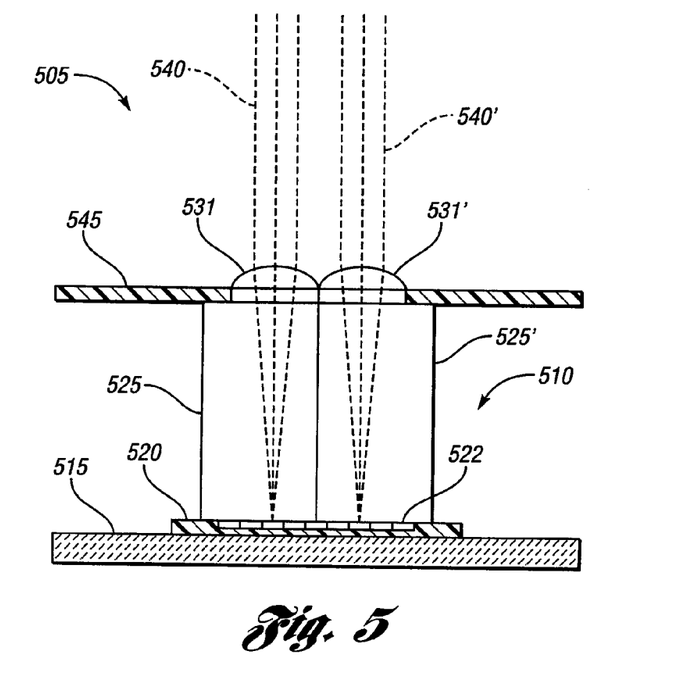
FIG. 5 is a schematic drawing of an automotive vehicle imaging system according to an alternative embodiment of the present invention.

An automotive vehicle imaging system may be configured as described in FIG. 4 or 5. As depicted in FIG. 4, the imaging system 405 includes an image sensor 410 mounted to a circuit board 415. Image sensor 410 includes imager die 420, including a plurality of pixels 422, and optical spacer 425. Imaging system 405 also includes a first lens 431 configured for focusing light rays 440 from a scene upon the image sensor. Imaging system 405 further includes mask 445 configured to form an aperture around the first lens. The overall image sensor resolution is 144×176 pixels.

As depicted in FIG. 5, the imaging system 505 includes an image sensor 510 mounted to a circuit board 515. Image sensor 510 includes imager die 520 with pixels 522 and optical spacers 525, 525'. Imaging system 505 also includes lenses 531, 531' and aperture 545. First lens 531 focuses light rays 540 from a scene through optical spacer 525 onto half of pixels 522. Second lens 531' focuses light rays 540' from the scene through optical spacer 525' onto the other half of pixels 522. Optical spacer 525 is constructed to have different optical properties than optical spacer 525'. This may be accomplished by varying the bulk properties of optical spacer 525, coating the top surface of optical spacer 525 (nearest lens 531), and/or coating the bottom surface of optical spacer 525 (nearest imager die 520). Optical surface coatings and optical bulk properties to achieve a variety of optical filters are well known in the art.

The overall image sensor resolution is 176×144 pixels. However, the array is split in two halves, each of which images substantially the same scene but one half does so through a spectral filter. Each half uses a sub-window of pixels, for example 144 pixels wide by 50 pixels high. In one embodiment, the unfiltered half may be used for lane detection. The field of view is preferably approximately 0.2 degrees per pixel. The lane detection algorithm preferably operates on the lower region of the image, for example the bottom 15 rows, and does not necessarily utilize all columns. It should be understood that the following and subsequent examples may be applied to various image sensors with various resolutions and various optical configurations. As costs of image sensors and processors decrease, it may be advantageous to use an image sensor with higher resolution and a wider field of view, for example 50 degrees or more. The wider field of view will allow a larger aim correction, better detection of vehicles around curves, and tolerance to a wider range of windshield angles.

Image sensors and image processing systems are increasingly being employed to perform a wide variety safety and convenience functions in motor vehicles. Examples of such functions include vision assistance, headlamp control, rain sensing, lane departure warning, collision avoidance, sign recognition, and adaptive cruise control. In some cases, where the fields of view needed for the application are similar or overlap, it is desirous to use a single camera to perform more than one of these or other functions. A single camera will require less physical space and may be less expensive than using multiple dedicated cameras.

While the use of a single camera to perform multiple functions is initially appealing, there are several technical and commercial obstacles complicating this goal. Many of the applications listed above require a field of view substantially in front of the vehicle, however the requirements of the camera are substantially different. A headlamp control system, which identifies the headlamps and tail lamps of oncoming and preceding vehicles, requires a field of view of 30° to 50°, a resolution of approximately 5-10 pixels per degree, very high intra-scene dynamic range (i.e. the ability to sense a wide variety of light levels within a single image), very accurate color measurement for point light sources, and a frame rate of approximately 5 frames per second. A lane departure warning system requires a field of view of approximately 25° to 35°, a resolution of greater than 5 pixels per degrees, a wide interscene dynamic range to adapt to varying daytime and nighttime light levels, and a frame rate of approximately 10 frames per second. A sign recognition system requires a narrower field of view but a very high resolution of greater than 20 pixels per degree.

Figure 6:
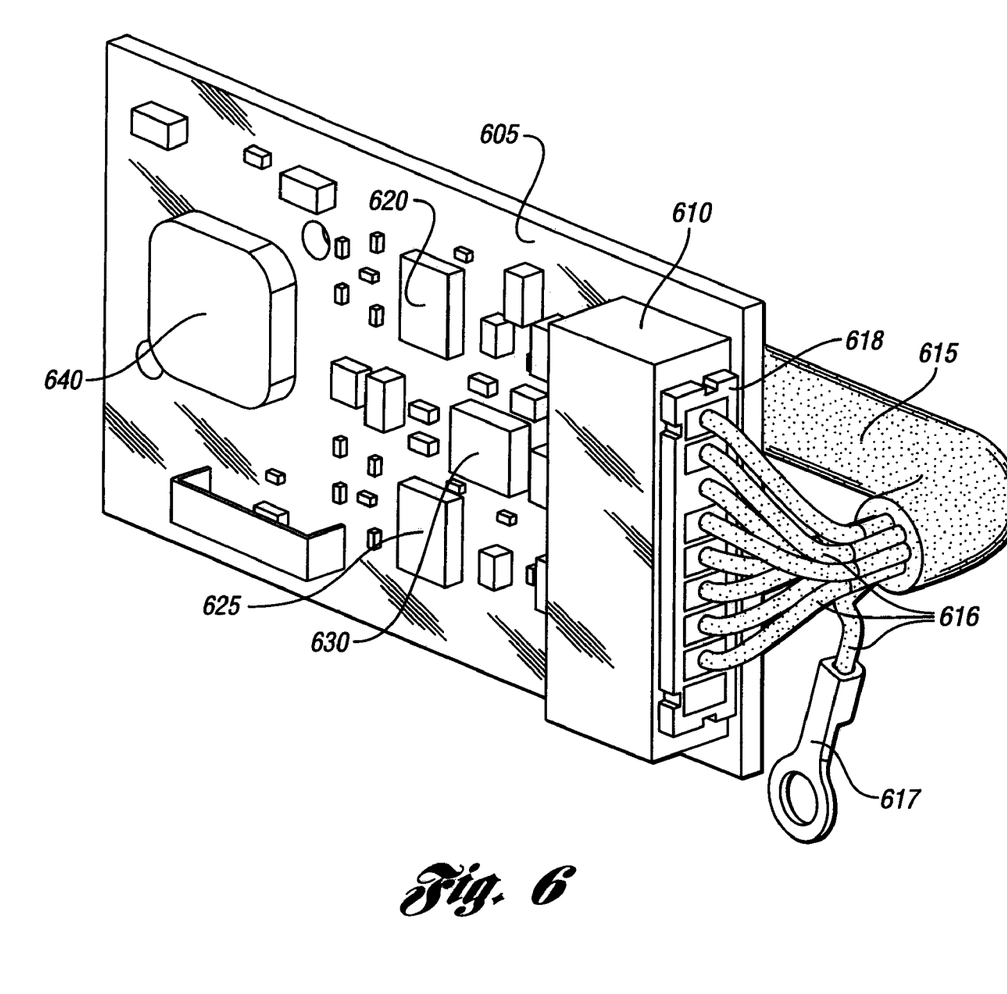
FIG. 6 is a drawing illustrating an image sensor electronic subassembly according to an embodiment of the present invention.

Automotive image sensors may be incorporated into an electronic subassembly as depicted in FIG. 6 including an imager board 605 having a receptacle 610. It should be understood that the receptacle may comprise at least a portion of male contacts and at least a portion of female contacts, although, a given receptacle may comprise only female or only male contacts. It should also be understood that a plug may be used in lieu of a receptacle when the plug 618 is reconfigured as a receptacle. In any event, any given plug or receptacle may be configured with at least a portion as a receptacle, at least a portion as a plug or a combination thereof. Any given plug and/or receptacle may be configured as described in commonly assigned U.S. patent application Ser. No. 10/783,273 (published as U.S. Publication No. 2004/0164228). In at least one embodiment a wire harness 615 is provided having a plurality of individual conductors 616. In at least one embodiment, at least one of the individual conductors is terminated into a plug or receptacle and at least one of the individual conductors is terminated into a connector 617. In at least one embodiment, an imager board comprises at least one low voltage differential signal driver 625, a microprocessor 630, a QBURT circuit 620, an image sensor subassembly 640, a sub-combination thereof or combination thereof. Imager board 605 may be incorporated into an automotive vehicle at a variety of locations including, for example, interior and/or exterior rearview mirror assemblies.

Figure 7A:
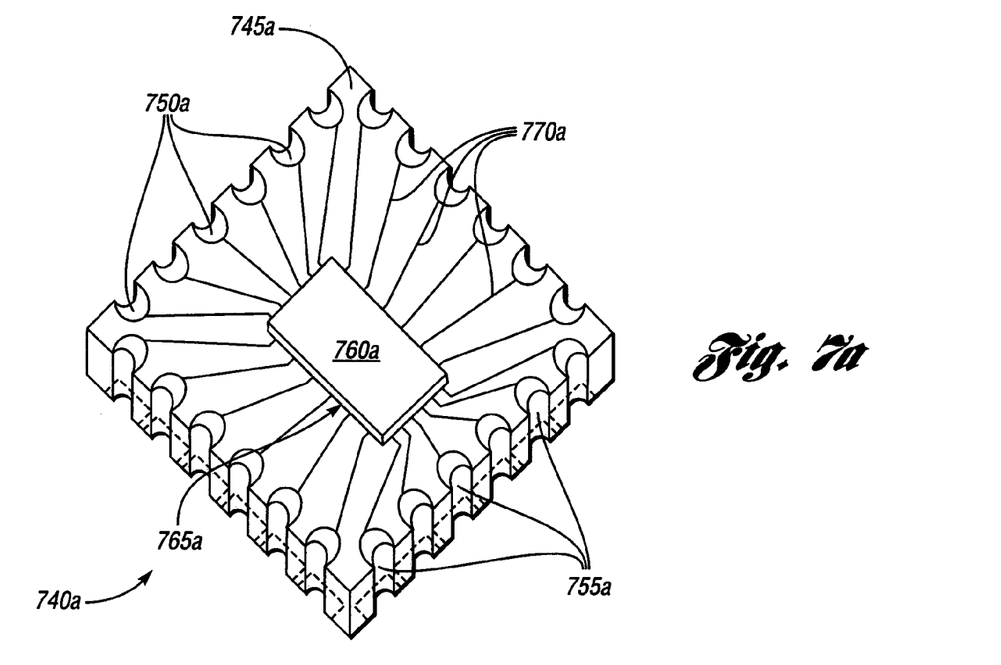
FIGS. 7a-7d are drawing illustrating assembly of an automotive vehicle image sensor according to an embodiment of the present invention.

FIG. 7a depicts an embodiment of an image sensor subassembly 740a comprising a printed circuit board 745a having upper castellation portions 750a and lower castellation portions 755a. The castellations are configured such that the printed circuit board may be reflow soldered as a subassembly onto another substrate, such as an imager board. In at least one embodiment, a printed circuit board comprises associated surface mount components such as filter capacitors that may be added before a silicon die 760a is, or dies are, attached via die attach epoxy 765a. In at least one embodiment, interconnections 770a extend from the castellations and a corresponding wire bond (not shown) to the corresponding electronic component such as the silicon die. In at least one embodiment, a silicon die comprises at least one image array sensor, at least one image array sensor control circuitry, at least one analog-to-digital circuit, at least one microprocessor, at least communication interface, a sub-combination thereof or a combination thereof. In at least one embodiment, an imager system assembly comprises a first image sensor configured within a vehicle such that one of the image sensors is aimed having a primary optical axis vertically below a second image sensor. In this configuration, the first image sensor may be configured for automatic vehicle light control and the second image sensor may be configured for lane departure warning, vehicle heading assist, vehicle heading control, a sub-combination thereof or a combination thereof. It should be understood that, in at least one embodiment, a first and second image sensor are configured as described elsewhere herein in addition to, or in lieu of, that just described. It should be understood that a nonconductive die attach epoxy, such as Ablebond 84-3 available from Ablestik, a National Starch & Chemical Company, Rancho Dominquez, Calif. may be employed. In at least one embodiment a conductive epoxy, DA 5933, available from Engineered Material Systems, Incorporated, Delaware, Ohio is employed to attach additional electrical components to a printed circuit board along with a silicon die or silicon dies. It should be understood that any known conductive epoxy having a viscosity, Brookfield DV-III+, cp#51 at approximately 0.5 rpm of approximately 58,800 cps and at approximately 5.0 rpm of approximately 9530 cps; a thix ratio of approximately 6.17; a color (visual) of approximately silver; a cure schedule of approximately thirty minute ramp to 175 degrees Celsius plus one hour at 175 degrees Celsius; an operating temperature range between approximately −60 degrees Celsius to approximately 175 degrees Celsius; glass transition temperature (DMA-onset) of approximately 150 degrees Celsius; thermal conductivity of approximately 10.0 W/m.K and volume resistivity of approximately $9 \times 10^{-5}$ ohm.cm may be used.

Figure 7B:
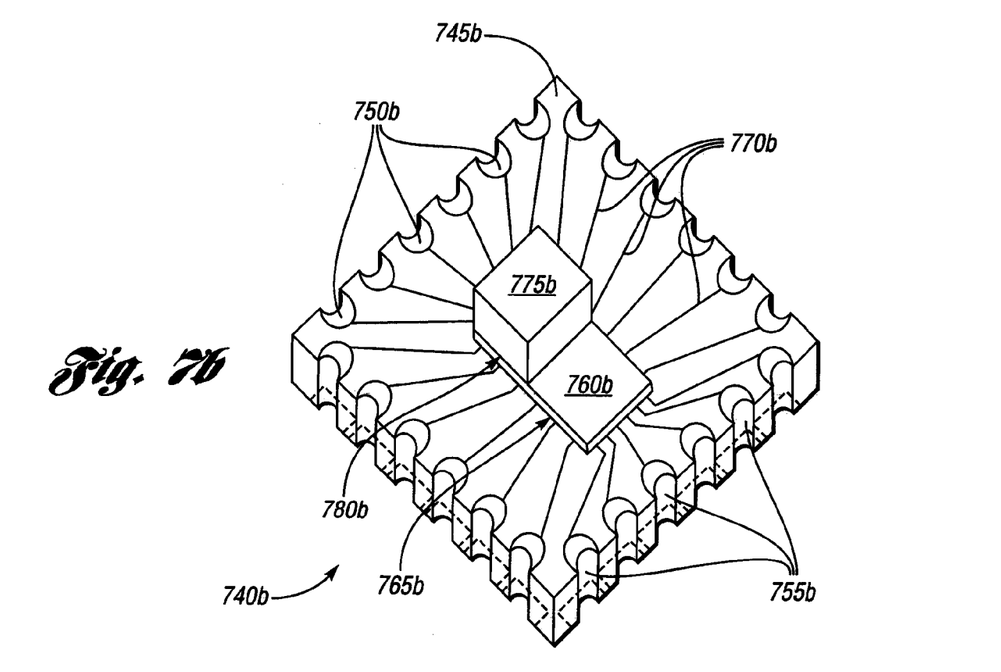

Turning to FIG. 7b, an image sensor subassembly 740b is depicted comprising a printed circuit board 745b having upper castellation portions 750b and lower castellation portions 755b. In at least one embodiment a silicon die 760b is, or silicon dies are, attached to the printed circuit board via die attached epoxy 765b. In at least one embodiment, a glass cover 775b is placed over at least a portion of a silicon die utilizing an adhesive 780b. In at least one embodiment, adhesive FP4501 available from Henkel KGaA, D-40191 Dusseldorf, also known as Henkel-Hysol or Loctite-Hysol, formerly Dexter, may be used. In at least one embodiment, interconnections 770b extend between the castellations and a given wire bond (not shown) to a desired component connection.

Figure 7C:
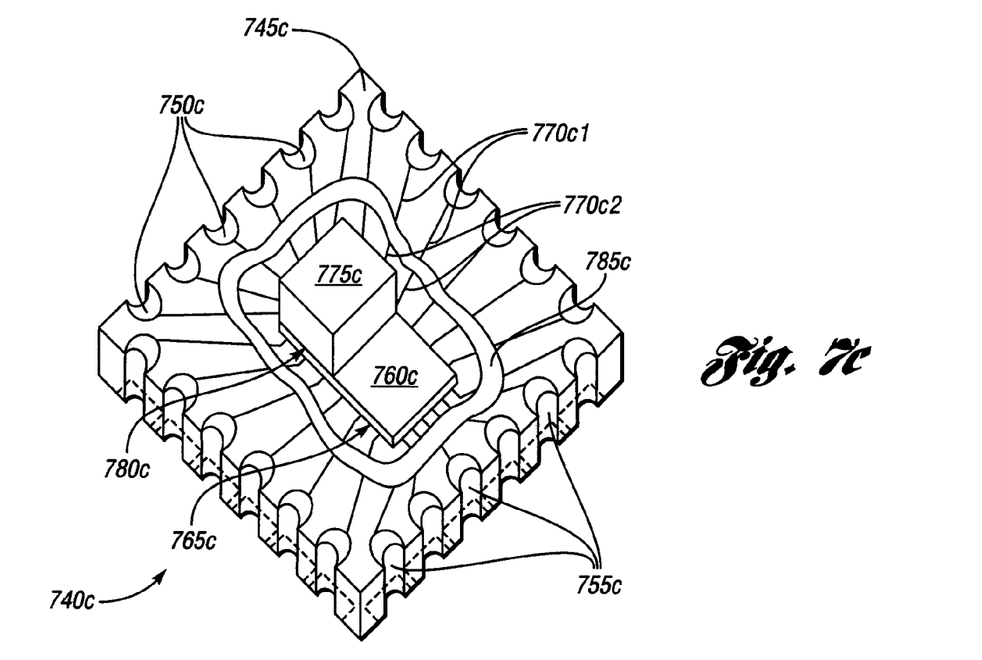

Turning now to FIG. 7c, an image sensor subassembly 740c is depicted comprising a printed circuit board 745c having upper castellation portions 750c and lower castellation portions 755c. In at least one embodiment, a silicon die 760c is, or silicon dies are, attached to the printed circuit board via die attached epoxy 765c. In at least one embodiment, a glass cover 775c is placed over at least a portion of a silicon die utilizing an adhesive 780c. The adhesive may be applied to the silicon die, the glass cover, or both. In at least one embodiment, a dam 785c is formed of a relatively high viscosity epoxy material surrounding at least one silicon die, at least one electrical component, a sub-combination thereof or a combination thereof. In at least one embodiment, first interconnection portions 770c1 extend between the castellations up to the dam and second interconnection portions 770c2 extend from the other side of the dam to a given wire bond (not shown) to a desired component connection. The portions of the interconnections between the first and second interconnection portions extend under the dam material. In at least one embodiment, the dam material is FP4451TD, available from Henkel KGaA. It should be understood that any material having a viscosity at approximately 25 degrees Celsius, Brookfield CP51 at approximately 5 rpm (ATM-0018), of approximately 50,000 cP; a cure schedule of approximately 1 hour at approximately 150 degrees Celsius such as, for example, one hour at 125° C. followed by 1½ hours at 165° C.; a temperature cycle range from approximately −65 degrees Celsius to approximately 150 degrees Celsius; an alternate cure schedule of approximately 2 hours at approximately 150 degrees Celsius and a glass transition temperature of approximately 85 degrees Celsius and coefficient of thermal expansion (ITM65B) at alpha 1 (from approximately 40 degrees Celsius to approximately 120 degrees Celsius) of approximately $21 \times 10^{-6}$ in/in/° C. and alpha 2 (from approximately 190 degrees Celsius to approximately 220 degrees Celsius) of approximately $76 \times 10^{-6}$ in/in/° C. may be used.

Figure 7D:
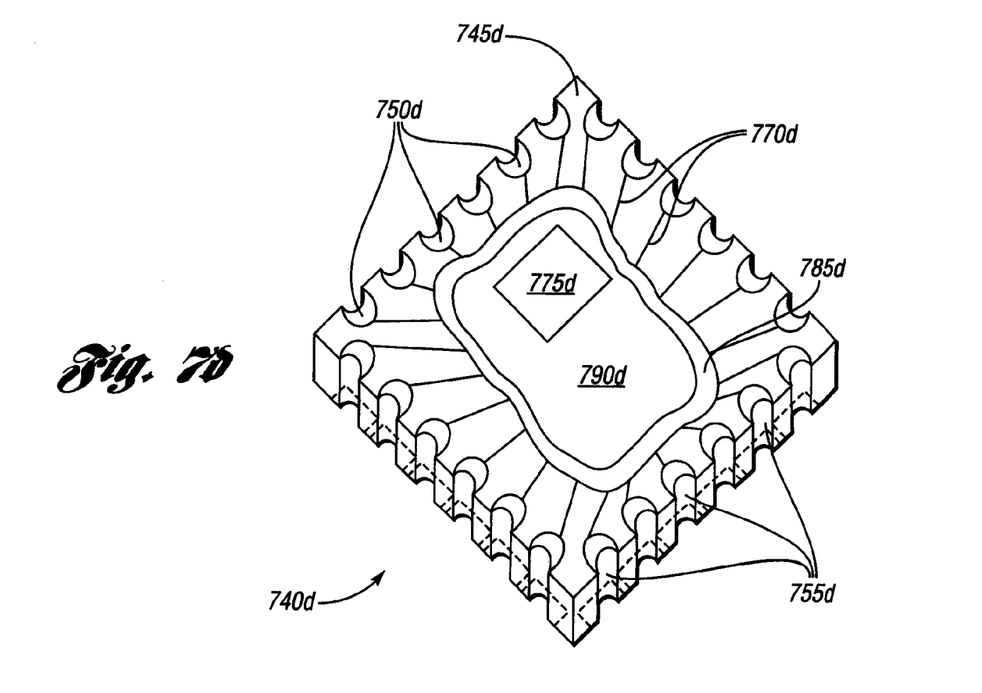

FIG. 7d depicts an image sensor subassembly 740d having upper castellation portions 750d and lower castellation portions 755d. In at least one embodiment, a silicon die (not shown) is, or silicon dies are, attached to the printed circuit board via die attached epoxy (not shown). In at least one embodiment, a glass cover 775d is placed over at least a portion of a silicon die utilizing an adhesive (not shown). In at least one embodiment, a dam 785d is formed of a relatively high viscosity epoxy material surrounding at least one silicon die, at least one electrical component, a sub-combination thereof or a combination thereof. In at least one embodiment, a relatively low viscosity fill material 790d is placed between a dam and a glass cover such that the top of the glass cover is farther away from an associated printed circuit board than any portion of the dam and/or fill materials and such that the desired silicon die, silicon dies, additional component, sub-combination thereof or combination thereof is, are, encapsulated. In at least one embodiment, the fill material is C092542, available from Henkel KGaA, alternatively CNB925-42 or FP4800 or any other similar known relatively low viscosity fill material may be used having a viscosity at approximately 25 degrees Celsius, (ITM2A), Brookfield HBT, Spindle 7, Speed 10, of approximately 80,000 Cp; glass transition temperature (ITM65B) of approximately 55 degrees Celsius; a cure schedule of approximately 60 minutes at approximately 120 degrees Celsius plus approximately 120 minutes at approximately 165 degrees Celsius; a temperature cycle range from approximately −65 degrees Celsius to approximately 150 degrees Celsius; an alternate cure schedule of approximately 30 minutes at approximately 125 degrees Celsius plus approximately 90 minutes at approximately 165 degrees Celsius and coefficient of thermal expansion (ITM65B) at alpha 1 (less than approximately 55 degrees Celsius) of approximately $18 \times 10^{-6}$ in/in/° C. and alpha 2 (from approximately 190 degrees Celsius to approximately 220 degrees Celsius) of approximately $78 \times 10^{-6}$ in/in/° C. In at least one embodiment, first interconnection portions 770d extend between the castellations up to the dam and second interconnection portions (not shown) extend from the other side of the dam to a given wire bond (not shown) to a desired component connection. The portions of the interconnections (not shown) between the first and second interconnection portions extend under the dam material. In at least one embodiment, the dam material is FP4451TD, available from Henkel KGaA. In at least one embodiment both the dam material and the fill material are cured together after placement of each. In at least one embodiment the dam material is at least partially cured prior to placement of the fill material.

It should be understood that the image sensor subassembly as described with reference to FIGS. 7a-d may be placed directly on an imager board without an interposing printed circuit board. It should be understood that any of the optics and optics placement methods taught in the various commonly assigned U.S. patents and U.S. patent Applications incorporated elsewhere herein by reference may be employed irrespective of the given embodiment of image sensor subassembly selected. It should be understood that spectral filter materials as described in the commonly assigned U.S. patents and patent Applications incorporated elsewhere herein or as known in the art may be incorporated on a surface of, or within, a glass cover in lieu of or in addition to spectral filters located elsewhere in a given assembly.

Figure 8:
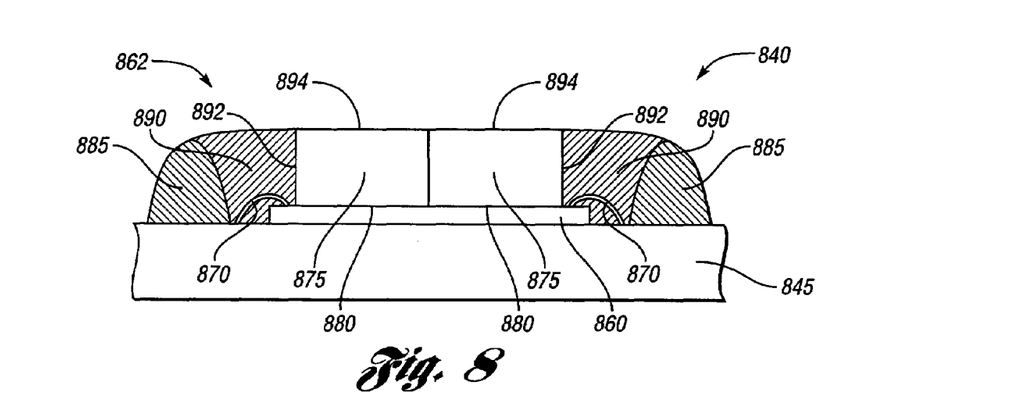
FIG. 8 is a cross-sectional view of a vehicle image sensor according to an embodiment of the present invention.

Referring now to FIG. 8, a cross-sectional view of a vehicle image sensor according to an embodiment of the present invention is shown. Vehicle image sensor 840 includes substrate 845 upon which imager die 860 is attached. Imager die 860 may be attached using a conducting or nonconducting adhesive material or may be attached through an electrical connection such as wires, pins, a ball grid array, or the like. If electrical connections are not otherwise made, interconnecting wires 870 may be welded or wire bonded between imager die 860 and substrate 845. At least one optical spacer 875 is adhered directly onto imager die 860 by a substantially optically transparent adhesive 880. Dam material 885 is deposited on substrate 845 substantially around imager die 860 forming walls defining fill region 862. Fill material 890 is placed within fill region 862 formed by dam material 885 to cover portions of imager die 860 and an interface area 892 along the sides of the at least one optical spacer 875, but leaving a top surface 894 of the at least one optical spacer 875 uncovered. Top surface 894 of each optical spacer 875 may be coated with or may support an optical filter. Alternatively, or in addition to, the use of surface coatings or covering filters, each optical spacer 875 may have different bulk optical properties.

Figure 9:
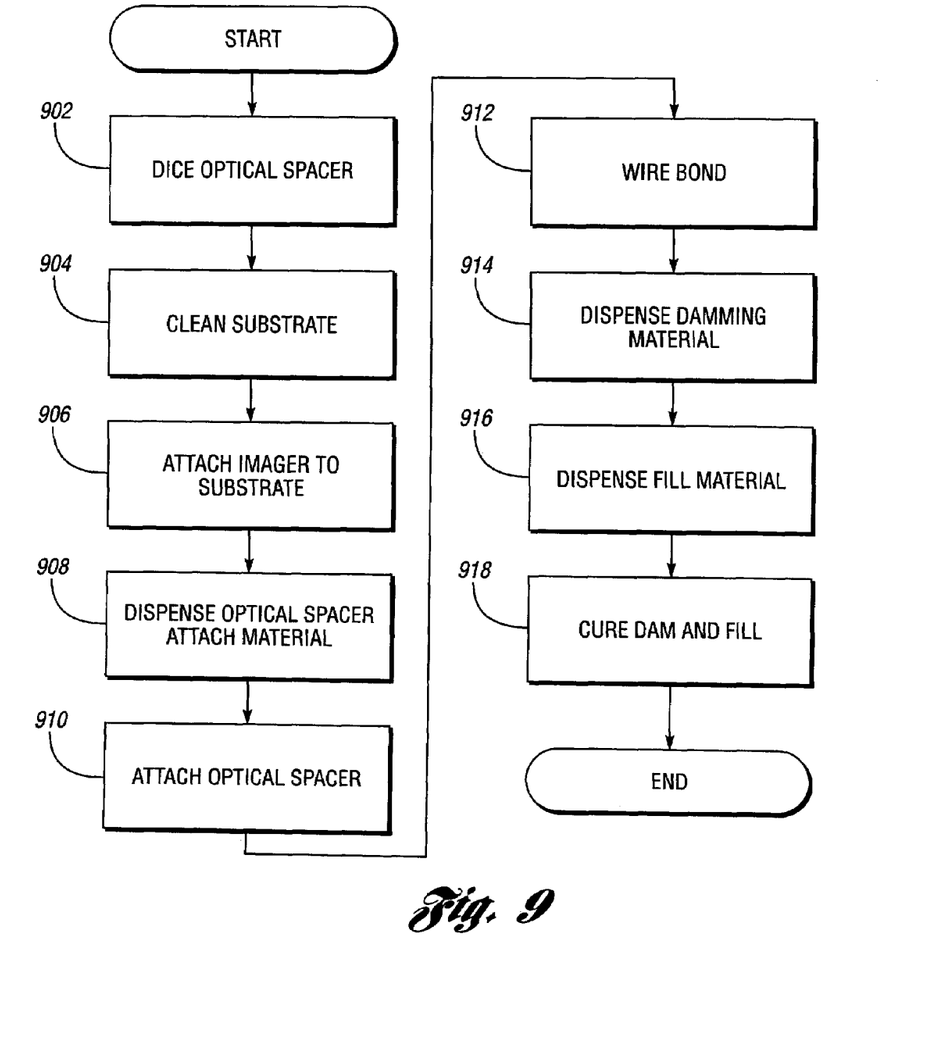
FIG. 9 is a flowchart illustrating a method of making a vehicle image sensor according to an embodiment of the present invention.

Referring now to FIG. 9, a flowchart illustrating a method of making a vehicle image sensor according to an embodiment of the present invention is shown. A flowchart is used for convenience and, as will be recognized by one of ordinary skill in the art, some of the steps illustrated may be performed in an order different than the one shown. Moreover, not all steps illustrated are necessarily required for the present invention.

The optical spacer is diced, as in block 902. The optical spacer is preferably made of glass, though a substantially transparent plastic material such as acrylic, polycarbonate, and the like, may also be used. The size of the optical spacer is dependent upon several design parameters, including the number of spacers to be used with each imager, the imager size, the spacer material, the desired focal or spacing length (i.e., thickness of the spacer), the imaging application, and the like. In an embodiment of the present invention, the optical spacer is glass and is dimensioned to cover the imaging portion of the optical die. For example, the optical spacer has a length of 3.43 mm, a width of 2.95 mm, and a thickness of between 0.55 mm and 5 mm depending upon the application. The optical spacer may include as a bulk property or may be coated on one or more sides with material that affects the optical properties of the optical spacer. This allows reducing electromagnetic radiation in undesirable frequencies while leaving the optical spacer substantially transparent to electromagnetic radiation desired to form an image on the image sensor.

The optical spacer is preferably diced such that there are minimal scallops, chips, or edge defects. Mechanical defects in the optical spacer surfaces may promote subsequent cracking after dam and fill. Dicing tape may be used to limit mechanical damage. Techniques for cutting the optical spacer depend upon the spacer material, size, shape, equipment to be used, and the like. In one embodiment, the glass may be cut with a 400 grit 0.006 inch (0.15 mm) thick resin/diamond composite blade with a minimum of 1.6 mm of exposure. The spindle should be run at 45,000 rpm with a wafer feed rate of 1.5 mm/second. The water flow should be 1.3 to 1.5 liters/minute for all settings.

Following dicing, the optical spacer must be free of foreign material (e.g., anything not belonging on the surface by design, or design intent) and particulates prior to joining these two elements at the wafer mounting operation.

As an alternative to dicing, the optical spacer may be molded or otherwise formed into the desired shape.

The substrate is cleaned, as in block 904. The substrate may be, for example, a printed wiring board (PWB). Surfaces should be free of flux and fingerprint residue to permit reliable die attach and wire bond interfaces. As is well known in the art, a variety of cleaning equipment and techniques are available, such as from Crest Ultrasonics of Trenton, N.J.

The imager die is attached to the substrate, as in block 906. In a preferred embodiment, the die attach adhesive is capable of withstanding the processing and stresses of the dam and fill material. This die attach material may be a one component, solvent-free epoxy chip adhesive such as Ablebond 84-3 from Ablestik of Rancho Dominguez, Calif. The die may also be attached with a snap cure epoxy such as Ablestik 2035SC. The assembly is cleaned, prior to wire bonding using a process such as, for example, plasma cleaning, as is known in the art. The imager die may then be wire bonded to the substrate or wire bonding may occur later, as in block 912.

Optical spacer attach material is dispensed, as in block 908. The optical spacer attach material is preferably an optically clear, unfilled material such as, for example, a single component, B-stage clear epoxy such as Epo-tek MA-5 from Epoxy Technology, Inc., of Billerica, Mass. The optical spacer attach material may also be a UV cure material such as Light Weld® 429 from Dymax Corp. of Torrington, Conn. The dispense may be performed by writing an "X" pattern or dispensing in a pattern of five dots in the shape of an "X" on the top surface of the imaging portion of the optical die. If written in an "X" pattern, a central dot is formed then four consecutive lines, beginning at the outer extremes and terminating in the center (adding to the central mass). When utilizing the five dot approach, the central dot is preferably the largest in diameter and/or the greatest in height. Precautions should be taken to prevent foreign material from becoming entrapped on the top surface of the optical die or in the adhesive after dispensing.

The optical spacer is attached, as in block 910. The optical spacer is preferably placed immediately after the dispense of the optical spacer adhesive to prevent skinning-over of the adhesive and subsequent incorporation of visual anomalies into the cured interface as well as to minimize the potential for entrapment of foreign material. Placement velocity should be slow enough to allow the adhesive front to wet the interfaces while moving to the perimeter of the optical spacer. Placement force should be repeatable within ±10% and adjustable within a range of 75-250 grams. The placement force should be of sufficient magnitude and duration to assure that the adhesive front progresses to the perimeter of the optical spacer. In one embodiment, a barely visible fillet is formed around three continuous sides of the optical spacer's perimeter. On the side of the chip without bond pads, the optical spacer is preferably flush with the edge of the imager die, not leaving room for a fillet. Preferably, the interface between the optical spacer and imager is completely filled with adhesive, with no voids or air bubbles. Preferably, the optical spacer attach fillet shell extends between 125 µm to 250 µm outward, or upward, on any surface. Excess material volume may cause the optical spacer location to shift uncontrollably during cure. Preferably, the optical spacer attach material does not flow out onto the wire bond areas. The optical attach material is preferably cured such as, for example, in a forced-air convection oven at a temperature of 150° C.±5° C. for between 30 and 60 minutes. Cure times and methodology depend on a variety of factors including attach material, optical spacer construction, imagine die construction, and the like.

Wire bonding electrical connections are made between the substrate and the imager die, as in block 912. Wire bonding techniques are well known in the art.

Damming material is dispensed, as in block 914. The dam creates a barrier to prevent the flow of the low viscosity fill material. Preferably, the dam is deposited beyond the primary wedge bonds and has a sufficient final height to allow the fill to cover the highest points of the wire loops and some portion of the optical spacer element placed on the optical die. Placement of the dam may be based upon avoiding obstacles such as devices, wires and chip components, but may also serve to plug any vias or anchor holes within the fill region. Preferably, the dam material allows for the creation of a tall, narrow dam having the robustness to retain its shape and contain the fill material during cure. For example, Hysol FP4451TD available from Henkel Loctite Corp. of Rocky Hill, Conn., may be used.

In one embodiment, the dam may be created in a two step sequence. The first step is to lay down a complete ring of the damming material to a height of approximately 0.89 mm. The corresponding width of the damming deposit should be approximately 1.52-1.78 mm at the base. The second step is to lay down another ring of damming material (on top of the first) to an overall height of approximately 1.91 mm. Additional layers may be used as needed. The distance from the center-line of the dispense needle (18 Ga needle) to the edge of the device should be 0.060-0.080 inches (1.52-2.03 mm). While not necessary, the substrate may be warmed during the dispense of the damming material, allowing for an increase in linear dispense speed. Pre-heat temperatures of 50-70° C. substrate surface temperature may be used. If warming is used, it is preferential to warm the substrate and not the damming material itself. Heat may also be applied to the valve/needle assembly. As is known in the art, a time/pressure dispense system can be used for this application.

Damming material that is dispensed onto the substrate is preferably filled within the next four hours and cured immediately thereafter. If it is known that there will be more than about a 1-2 hour delay between dam and fill operations, the dammed product is preferably stored in a nitrogen cabinet until available for the filling operation or the damming operation is delayed until immediately before the anticipated fill operation.

Fill material is dispensed, as in block 916. Preferably, the substrate is warmed during the dispense of fill material to minimize the apparent viscosity of the fill material. This reduces the potential for air entrapment beneath closely spaced groups of wire bonds, miscellaneous components, and the like. Pre-heat temperatures of 50-70° C. at the surface of the substrate may be used. When warming, it is preferential to warm the substrate and not the fill material itself. As an alternative, or in addition to, heating the substrate, heat may be applied to the valve/needle assembly. The flow rate of the fill material during the dispense operation is at least in part, a function of the pre-heat temperature and the presence or absence of holes or other air entrapping objects. The speed at which the dispense needle moves is dependent at least in part on the rate at which the fill material wets the substrate and flows around obstacles on the substrate surface. The path used to dispense fill material may traverse partially around the device, then reverse direction briefly to allow the fill front to catch up, then resume forward motion. The entire fill operation may require two circuits around the device to form a consistent and uniform fill and associated fillet to the optical spacer. Preferably, the fill material completely covers all connecting wires. The meniscus of the fill material preferably terminates on the optical spacer within the upper-most 0.015 inch (0.38 mm), forming an included angle of 20-45° with the vertical facet of the optical spacer. The fill material may be, for example, Hysol FP4470 available from Henkel Loctite Corp. of Rocky Hill, Conn.

The dam and fill materials are cured, as in block 918. The damming material may be co-cured along with the fill material. Depending upon the dam and fill materials and the desired properties, a two step cure may be used. For example, the cure may include 50-60 minutes at 125±5° C. followed by 90-120 minutes at 165 ±5° C. In this example, the dammed and filled imager assemblies should begin curing within two hours of being filled. The assemblies may be inserted into an oven already at 125° C. or in an oven at room temperature followed by a temperature rise rate from 25° C. to 125° C. at less than 50° C./minute and an oven rise rate from 125° C. to 165° C. at 2-5° C./minute.

Various additional operations may follow. For example, one or more filters and/or lenses may be positioned above or upon the optical spacer. The imaging assembly may also be assembled onto a larger circuit board for inclusion within an automotive vehicle.

In one embodiment, a red/cyan filter is formed on at least one surface of the optical spacer, such as the top surface or the bottom surface. After cleaning the surface, photoresist is spun onto the surface. The photoresist is exposed to UV light through a cyan pattern contact mask then is developed. A cyan filter coating is then deposited on the surface. The photoresist is then removed to "lift off" the cyan filter coating from regions of the surface where the cyan filter is not desired. The process is repeated to form a red filter deposited on the surface. A blanket coating of a broadband antireflection (BBAR) material may then be applied to the surface. The use of photoresist and the application of filter and BBAR layers is well known in the art. The resulting optical spacer has two zones, each with differing optical properties. The same technique may be used to create any number of optical zones on a single optical spacer and/or to create optical spacers each having different optical properties.

One or more optical spacers may also be molded, machined, assembled, or otherwise formed to include one or more lenses. If a lens affects only a portion of the light passing through the optical spacer, the optical spacer will have optical zones each having different optical properties.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of making an image sensor for use in an automotive vehicle, the method comprising:
    adhering an imager die on a substrate, the imager die including a plurality of pixels;
    adhering bottom surfaces of a plurality of optically transparent optical spacers directly to respective portions of the imager die above the plurality of pixels;
    depositing a damming material on the substrate substantially around the imager die so as to form a fill region, wherein the damming material has a viscosity;
    depositing a fill material on the substrate in the fill region, the fill material covering the imager die and a portion of the optically transparent optical spacers not including top surfaces of the optically transparent optical spacers, wherein the fill material has a viscosity lower than the viscosity of the damming material;
    whereby light passes through the optical spacer top surfaces and the optical spacer bottom surfaces to reach the plurality of pixels.

2. The method of making the image sensor of claim 1 further comprising co-curing the damming material and the fill material.

3. The method of making the image sensor of claim 1 wherein adhering the optically transparent optical spacers to the imager die comprises:
    depositing an optically clear epoxy onto the imager die;
    pressing the optically transparent optical spacers onto the optically clear epoxy; and
    curing the optically clear epoxy.

4. The method of making the image sensor of claim 1 wherein depositing a damming material substantially around the imager die comprises:
    laying down a first ring of damming material; and
    laying down a second ring of damming material on top of the first ring of damming material.

5. The method of making the image sensor of claim 1 further comprising dicing the optically transparent optical spacers from a sheet of glass.

6. The method of making the image sensor of claim 1 further comprising depositing at least one filter on the top surface of at least one optically transparent optical spacer.

7. The method of making the image sensor of claim 6 wherein each of the at least one filter is deposited on a respective portion of the top surface of the at least one optically transparent optical spacer, whereby the at least one optically transparent optical spacer has a plurality of zones, at least one of the plurality of zones having an optical property different than at least one other of the plurality of zones.

8. The method of making the image sensor of claim 1 further comprising wire bonding the imager die to the substrate.

9. A rearview mirror assembly for an automotive vehicle, the rearview mirror assembly comprising:
    a housing;
    a printed circuit board disposed within the housing;
    an image sensor affixed to the printed circuit board, the image sensor including
        a substrate;
        an imager die including a plurality of pixels operative to capture an image, the imager die affixed on the substrate;
        a plurality of optical spacers directly adhered to respective portions of the imager die above the plurality of pixels, each optical spacer substantially transparent to light from the captured image, each optical spacer having sides extending from the imager die, a bottom surface immediately across from the plurality of pixels, and a top surface opposite from the bottom surface;
        dam material on the substrate forming a dam wall substantially around the imager die, the dam wall forming a fill region within the dam material, wherein the dam material has a viscosity; and
        fill material on the substrate disposed within the fill region, the fill material covering a portion of the imager die and at least a portion of the optical spacer sides but not covering the optical spacer top surfaces, wherein the fill material has a viscosity lower than the viscosity of the dam material;
    whereby the plurality of pixels captures the image by receiving light through the optical spacers.

10. The rearview mirror assembly of claim 1 wherein the optical spacers are adhered to the imager die with an optically transparent adhesive.

11. The rearview mirror assembly of claim 1 wherein at least one of the plurality of optical spacers has an optical property different than at least one other of the plurality of optical spacers.

12. The rearview mirror assembly of claim 1 further comprising at least one lens positioned above at least one optical spacer top surface.

13. A rearview mirror assembly for an automotive vehicle, the rearview mirror assembly comprising:
    a housing;
    a printed circuit board disposed within the housing;

an image sensor affixed to the printed circuit board, the image sensor including
a substrate;
an imager die including a plurality of pixels operative to capture an image, the imager die affixed on the substrate;
at least one optical spacer directly adhered to the imager die above the plurality of pixels, the at least one optical spacer substantially transparent to light from the captured image, the at least one optical spacer having sides extending from the imager die, a bottom surface immediately across from the plurality of pixels, and a top surface opposite from the bottom surface;
dam material on the substrate forming a dam wall substantially around the imager die, the dam wall forming a fill region within the dam material, wherein the dam material has a viscosity; and
fill material on the substrate disposed within the fill region, the fill material covering a portion of the imager die and at least a portion of the optical spacer sides but not covering the optical spacer top surface, wherein the fill material has a viscosity lower than the viscosity of the dam material;
whereby the plurality of pixels captures the image by receiving light through the at least one optical spacer;
wherein the at least one optical spacer comprises an optical spacer having a plurality of zones which are directly adhered to respective portions of the imager die above the plurality of pixels, at least one of the plurality of zones having an optical property different than at least one other of the plurality of zones.

14. An image sensor for use in an automotive vehicle, the image sensor comprising:
a substrate having a top side;
an imager die having a top side and a bottom side, the top side including a plurality of pixels operative to capture an image, the imager die bottom side affixed to the top side of the substrate such that the plurality of pixels receives light from a direction opposite of the top side of the substrate;
an optically transparent adhesive on the imager die top side;
at least one optically transparent spacer directly adhered to the imager die top side by the optically transparent adhesive, wherein the at least one optically transparent spacer comprises an optically transparent spacer having a plurality of zones which are directly adhered to respective portions of the imager die top side by the optically transparent adhesive, at least one of the plurality of zones having an optical property different than at least one other of the plurality of zones;
dam material on the top side of the substrate forming a dam wall substantially around the imager die, wherein the dam material has a viscosity; and
fill material on the top side of the substrate disposed within the dam wall, the fill material covering a portion of the imager die and at least a portion of the optically transparent spacer, wherein the fill material has a viscosity lower than the viscosity of the dam material;
whereby the plurality of pixels captures the image by receiving light through the optically transparent adhesive and through the at least one optically transparent spacer.

15. The image sensor of claim 14 further comprising at least one lens positioned above the at least one optically transparent spacer.

16. An image sensor for use in an automotive vehicle, the image sensor comprising:
a substrate having a top side;
an imager die having a top side and a bottom side, the top side including a plurality of pixels operative to capture an image, the imager die bottom side affixed to the top side of the substrate such that the plurality of pixels receives light from a direction opposite of the top side of the substrate;
an optically transparent adhesive on the imager die top side;
a plurality of optically transparent spacers directly adhered to respective portions of the imager die top side by the optically transparent adhesive;
dam material on the top side of the substrate forming a dam wall substantially around the imager die, wherein the dam material has a viscosity; and
fill material on the top side of the substrate disposed within the dam wall, the fill material covering a portion of the imager die and at least a portion of the optically transparent spacers, wherein the fill material has a viscosity lower than the viscosity of the dam material;
whereby the plurality of pixels captures the image by receiving light through the optically transparent adhesive and through the optically transparent spacers.

17. The image sensor of claim 16 wherein at least one of the plurality of optically transparent spacers has an optical property different than at least one other of the plurality of optically transparent spacers.

* * * * *